(12) United States Patent
Shah

(10) Patent No.: US 7,511,491 B2
(45) Date of Patent: Mar. 31, 2009

(54) IMAGING PROCEDURE AND MAGNETIC-RESONANCE IMAGING SYSTEM FOR THE ACQUISITION OF THE LONGITUDINAL SPIN-LATTICE RELAXATION TIME

(75) Inventor: N. Joni Shah, Jülich (DE)

(73) Assignee: Forschungszentrum Julich GmbH, Julich (DE)

( * ) Notice: Subject to any disclaimer, the term of this patent is extended or adjusted under 35 U.S.C. 154(b) by 0 days.

(21) Appl. No.: 11/578,737

(22) PCT Filed: Mar. 30, 2005

(86) PCT No.: PCT/EP2005/003343

§ 371 (c)(1),
(2), (4) Date: Oct. 17, 2006

(87) PCT Pub. No.: WO2005/101048

PCT Pub. Date: Oct. 27, 2005

(65) Prior Publication Data

US 2007/0268019 A1    Nov. 22, 2007

(30) Foreign Application Priority Data

Apr. 19, 2004   (DE) ................. 10 2004 019 394

(51) Int. Cl.
*G01V 3/00*  (2006.01)
(52) U.S. Cl. .................................................. 324/307
(58) Field of Classification Search ......... 324/300–322; 600/410–435

See application file for complete search history.

(56) References Cited

U.S. PATENT DOCUMENTS

| | | | | |
|---|---|---|---|---|
| 4,727,325 A | * | 2/1988 | Matsui et al. | 324/309 |
| 4,746,864 A | * | 5/1988 | Satoh | 324/309 |
| 4,748,410 A | * | 5/1988 | Macovski | 324/309 |
| 4,757,260 A | | 7/1988 | Tsuda | 324/309 |

(Continued)

FOREIGN PATENT DOCUMENTS

EP    0 128 424 A2    5/1984

OTHER PUBLICATIONS

A Fast 3D Look-Locker Method for Voumetric T1 Mapping by Elizabeth Henderson, Graeme McKinnon, Ting-Yim Lee, and Brian K. Rutt in Magnetic Resonance Imaging, vol. 17, No. 8 pp. 1163-1171, 1999.

*Primary Examiner*—Dixomara Vargas
(74) *Attorney, Agent, or Firm*—Andrew Wilford

(57) ABSTRACT

An MR image imaging procedure for the acquisition of the longitudinal spin-lattice relaxation time has a data-acquisition module with a slice-selective α-high-frequency impulse as well as magnetic gradients ($G_x$, $G_y$, $G_z$) for slice selection and/or for encoding of a k-space. The acquired data describes a time point of a spin-lattice relaxation and the data-acquisition module for acquiring data of a further time point being repeated. A 180° high-frequency impulse or a 180° high-frequency impulse and a 90° high-frequency impulse preceding the 180° high-frequency impulse generating a spin-lattice relaxation precede the data-acquisition module. The magnetic gradients $G_x$ and $G_y$ for k-space encoding are simultaneously applied subsequent to the slice-selective α-high-frequency impulse. A temporal course of the magnetic gradients $G_x$ and $G_y$ is sinusoidal so that the result is a spiral coverage of the k-space and data are acquired during k-space encoding.

7 Claims, 6 Drawing Sheets

U.S. PATENT DOCUMENTS

| | | | |
|---|---|---|---|
| 4,972,148 A | 11/1990 | Jensen | 324/309 |
| 5,270,654 A | 12/1993 | Feinberg | 324/309 |
| 5,307,812 A * | 5/1994 | Hardy et al. | 600/411 |
| 6,064,203 A | 5/2000 | Bottomley | |
| 6,094,591 A | 7/2000 | Foltz et al. | |
| 6,111,411 A * | 8/2000 | Saranathan et al. | 324/313 |
| 6,597,935 B2 * | 7/2003 | Prince et al. | 600/410 |
| 6,603,989 B1 * | 8/2003 | Yablonskiy | 600/410 |
| 6,803,762 B2 | 10/2004 | Shah et al. | |
| 7,064,547 B1 * | 6/2006 | King et al. | 324/309 |
| 7,071,689 B2 * | 7/2006 | Golay et al. | 324/309 |

* cited by examiner

IMAGING PROCEDURE AND MAGNETIC-RESONANCE IMAGING SYSTEM FOR THE ACQUISITION OF THE LONGITUDINAL SPIN-LATTICE RELAXATION TIME

CROSS REFERENCE TO RELATED APPLICATIONS

This application is the US national phase of PCT application PCT/EP2005/003343, filed 30 Mar. 2005, published 27 Oct. 2005 as WO 2005/101048, and claiming the priority of German patent application 102004019394.0 itself filed 19 Apr. 2004, whose entire disclosures are herewith incorporated by reference.

FIELD OF THE INVENTION

The invention relates to an imaging procedure for the acquisition of the longitudinal spin-lattice relaxation time ($T_1$) with at least one data-acquisition module comprising at least one slice-selective α-high frequency impulse as well as magnetic gradients ($G_x$, $G_y$, $G_z$) for slice selection and/or for encoding a small k-space, where acquired data describe a time point of a spin-lattice relaxation and the data-acquisition module for acquiring data of at least one further time point is repeated, and where furthermore at least one 180° high-frequency impulse or at least one 180° high-frequency impulse and at least one 90° high-frequency impulse preceding the 180° high-frequency impulse for the generation of a spin-lattice relaxation precede at least one data-acquisition module.

Furthermore, the invention relates to a magnetic-resonance imaging system for the quantification of the longitudinal spin-lattice relaxation time ($T_1$) with means for generating magnetic gradients, means for generating high-frequency impulses, means for acquiring signal and means for generating a static main magnetic field.

STATE OF THE ART

The basic principles of the spatially resolved nuclear magnetic resonance, which have to be understood for the comprehension of the invention, are for example described in a monograph by P. Mansfield and P. G. Morris with the title "MMR Imaging in Biomedicine" (Academic Press, 1982) as well as in the monograph by P. T. Callaghan with the title "Principles of Nuclear Magnetic Resonance Microscopy" (Clarendon Press, Oxford 1991, ISBN 0198539444). Furthermore, the textbook "Magnetic Resonance Imaging" by E. Mark Haacke et al (Wiley-Liss, 1999) provides detailed descriptions regarding nuclear magnetic resonance as wells as nuclear magnetic imaging. Furthermore, in the above-described publication by Haake et al technical and functional data regarding the construction and operation of a magnetic-resonance imaging system can be found. The contents of the above-described publications as well as the abovementioned publications of the state of the art are included by reference in the present application.

Up to now, the quantitative display of the spin-lattice relaxation time $T_1$ was only of minor importance in clinical diagnostics since the hitherto-existing procedures require long acquisition times and consequently, their temporal resolution is too low for many medical examinations. One possibility of acquiring mainly $T_1$-weighted signals is the "snapshot FLASH" method by Deichmann and colleagues (Journal of Magnetic Resonance, Vol. 96, pp 608-612, 1992). The "snapshot FLASH" method requires, however, acquisition times in the range of 10 to 30 minutes due to waiting times for the restoration of the initial magnetization which may be a equilibrium magnetization (also called macroscopic magnetization). In the case of high spatial resolution, the temporal resolution is additionally limited.

In order to increase the temporal resolution, Ordidge and colleagues developed a faster imaging method than the above-described "snapshot FLASH" method for the acquisition of the mainly $T_1$-weighted signals on the basis of echoplanar imaging ("Inversion Recovery EPI Method", Magnetic Resonance in Medicine, Vol. 16, pp 238-245, 1990). This method, however, is not popular up to now since the artifacts inherent to echoplanar imaging make the method clinically unacceptable. Particularly spatial distortion regarding edge structures of objects within the reconstructed images, which even if the phase of the acquired signals is corrected cannot be completely avoided, lead to a reduction of the clinical importance of the procedure for the generation of mainly $T_1$-weighted images.

Most of the imaging methods for capturing the predominantly $T_1$-weighted signals which today are of clinical relevance, are based on the original work by Look and Locker (D. C. Look and D. R. Locker, The Review of Scientific Instruments, Vol. 41 No. 2, pp 250-251, 1970).

The method according to Look-Locker uses a plurality of successive, non slice-selective α-high-frequency impulses, subsequent to the inversion of an alignment of the macroscopic magnetization by means of a non slice-selective 180° high-frequency impulse, the alignment being an equilibrated alignment. Subsequent to the inversion of the magnetization core spins of a sample are excited during longitudinal spin-lattice relaxation by means of these non slice-selective α-high-frequency impulses, where signals are induced in high frequency coils so that signals can be measured more than once during spin-lattice relaxation. This procedure uses the relatively long time (~5 $T_1$) for restoration of the equilibrium magnetization in a particularly effective way for additional measurements.

German patent 100 28 171 (US equivalent U.S. Pat. No. 6,803,762) describes a pulse sequence of the generic kind, a magnet resonance imaging system and an imaging procedure for the acquisition of mainly $T_1$-weighted signals. The pulse sequence or respectively the imaging procedure are based on the Look-Locker method and comprise a slice-selective α-high-frequency impulse, a preceding, non slice-selective 180° high-frequency impulse used for inverting the alignment of the macroscopic high-frequency impulse, as well as magnetic gradients ($G_x$, $G_y$, $G_y$ [Translator's note: should read $G_z$]) for k-space encoding and slice selection. The particular feature of the procedure according to DE 100 28 171 consists in an advantageous sequence of repetitions of the slice-selective excitation, followed by the k-space encoding and the data acquisition, so that, after the inversion of the macroscopic magnetization, a sequence of mainly $T_1$-weighted signals is acquired during a spin-lattice relaxation.

The above-described procedures are based on the common objective to acquire mainly $T_1$-weighted signals in a clinical relevant time, wherein the reconstructed slice images should have a high spatial resolution. Compared to the above-described method according to DE 100 28 171, the IR-EPI method according to Ordidge et al is faster and thus has a higher temporal resolution than the procedure according to DE 100 28 171. It can, however, hardly be used in clinical diagnostics due to the low spatial resolution as well as to the non-negligible inherent artifacts of the echoplanar imaging method.

OBJECTS OF THE INVENTION

Thus, the object of the invention is to provide an imaging procedure of the generic kind which produces mainly $T_1$-weighted images with a high signal/noise ratio. Furthermore, the mainly $T_1$-weighted images should have a high spatial resolution.

The invention furthermore has the object of providing a magnetic-resonance imaging system of the generic kind, by means of which the above-described imaging procedure can be carried out.

SUMMARY OF THE INVENTION

According to the invention, this object is attained in that subsequent to the slice-selective α-high-frequency impulse, the magnetic gradients $G_x$ and $G_y$ for k-space encoding are simultaneously applied, a temporal course of the magnetic gradients $G_x$ and $G_y$ being sinusoidal, so that the k-space is spirally covered; and wherein furthermore data are acquired during k-space encoding.

The time-dependence of the spin-lattice relaxation is described with the time constant $T_1$. A temporal course of a regeneration regarding the longitudinal component of the macroscopic magnetization based on the acquisition of the time constant, basically has a mono-exponential course. The procedure according to the invention additionally allows the acquisition of the spin-lattice relaxation time, in which the temporal regeneration course of the longitudinal component of the macroscopic magnetization is bi-exponential or even multi-exponential.

The important advantage of the above-described procedure consists in the comparatively quick acquisition of mainly $T_1$-weighted signals compared to the state of the art.

Acquisition times within the range of a few seconds are thus possible according to the number N of time points. For example, mainly $T_1$-weighted signals that can be reconstructed at 25 different moments to form pictures with a spatial resolution of 256×256 picture elements (pixels) can be acquired in a clinical relevant time of ca. ½ minute. Due to the short acquisition time, this procedure can particularly be applied in the area of routine exams, particularly in areas where in addition to the low acquisition time, relatively small slice thicknesses in the range of 1-3 mm are required for medical diagnostic. If the spatial resolution is correspondingly reduced, it is possible, according to the invention, to achieve acquisition times of under one minute; and at the same time, to guarantee a high signal-noise-ratio of the mainly $T_1$-weighted images. The high signal-noise-ratio results for example from the high data acquisition rate in proximity to the origin of the k-space. It is generally known that the data have a high signal/noise ratio at and around the origin of the k-space, so that the result is a correspondingly high signal/noise ratio of the mainly $T_1$-weighted images.

A further advantage of the procedure according to the invention is a reduction of the partial volume effect such as is observed at the section transitions of picture elements or respectively volume elements (voxel) in reconstructed pictures, particularly in case of thick slices. The partial volume effect results from a mixture of different signal portions within a picture element in case of heterogeneous structures and thus in the case of heterogeneous signal portions. Generally, the thicker the slice, the higher the percentage of heterogeneous signal portions leading to geometrical distortions of the picture elements. The imaging procedure of the invention allows the data acquisition of thin slices and still provides a high signal/noise ratio. Consequently, the percentage of heterogeneous signals within the picture element and thus the partial volume effect is very small. The small partial volume effect directly leads to the increase in the accuracy of the reconstructed mainly $T_1$-weighted images provided according to the invention, which again leads to an increase in the accuracy of the acquired longitudinal spin-lattice relaxation time $T_1$.

The magnetic gradients ($G_x$, $G_y$, $G_y$ [Translator's note: should read $G_z$]) advantageously run orthogonally to each other in the space so that the vectors $k_x$, $k_y$, $k_z$ are orthogonal according to a functional connection $k=-\gamma \int G(t)dt$ between a resulting magnetic gradient G and the resulting vector k of the k-space, where t represents a time dependence. The Greek symbol γ represents a gyromagnetic ratio between the magnetic torque and the angular momentum of the sample to be examined. For example, the gyromagnetic ratio protons can be described as follows: $\gamma_H=2\pi \times 42.5749 \times 10^6$ rad $S^{-1}T^{-1}$. Such commitment to a Cartesian coordinate system for the description of the k-space is advantageous but not significant for the procedure. In fact, any description of the k-space may be selected, where, if necessary, the Cartesian coordinate system is transformed.

Advantageously, the temporal course of the gradients $G_x$ and $G_y$ leading to the spiral coverage of the k-space can be mathematically described as follows:

$$G_x(t)=\alpha_1 \sin(\alpha_2 t)+\alpha_1\alpha_2 t \cos(\alpha_2 t)$$

$$G_y(t)=\alpha_1 \cos(\alpha_2 t)+\alpha_1\alpha_2 t \sin(\alpha_2 t)$$

where the values for $\alpha_1$ and $\alpha_2$ are determined with regard to the Nyquist criterion. The gradients should advantageously be applied such that they can reach a maximal value in a time as short as possible.

Preferably, the sinusoidal temporal course of the magnetic gradients $G_x$ and $G_y$ leads to a complete spiral coverage of the k-space after the slice-selective α-high-frequency impulse. Thus, the mainly $T_1$-weighted picture of a slice representing the time point of the spin-lattice relaxation can already be reconstructed subsequently to the slice-selective α-high-frequency impulse and to the data acquisition of the acquired mainly $T_1$-weighted signals. Repeating the data-acquisition module for the acquisition of the data for at least one further time point, after reconstruction leads to a further mainly $T_1$-weighted image of the same slice for the further time point of the spin-lattice relaxation.

For the reconstruction, the acquired data are processed subsequently to the data acquisition and/or during data acquisition such that by means of the Fourier transform (or respectively by means of the fast Fourier transform (FFT)) mainly $T_1$-weighted images can be generated at N time points.

As a consequence of the sinusoidal temporal course of the magnetic gradients, acquired analog-digital converted data points in the k-space are not placed on a Cartesian grid; instead, the data points are situated along the spiral coverage of the k-space. In order to use the fast Fourier transform it is required to calculate the data sets such that after calculation, the acquired data points can be allocated to a Cartesian grid.

The procedures for processing (resorting of the data sets as well as association of the Cartesian raster) the acquired data are known to the one skilled in the art and are described suitable publications regarding this field. Optionally, the phase course map is formed of the acquired data or of the data of a further acquisition, in which, preferably, the gradients are not applied.

The generated mainly $T_1$-weighted images are used for a subsequent regression analysis (fitting) so that subsequent to the fitting the time constant $T_1$ is quantitatively available for each picture element (pixel) of the reconstructed picture.

It was found to be especially advantageous, when the slice-selective α-high-frequency impulse was substituted by a two-dimensional spectral-selective and spatial-selective high-frequency impulse. Such a high-frequency impulse is known to the one skilled in the art and is described in the publication by Meyer and colleagues (C. H. Meyer et al; Magnetic Resonance in Medicine; Vol. 15; pp 287; 1990). A particularly advantageous spectral-selective and spatial-selective high-frequency impulse is used for the suppression of proton signals of fat molecules. Thus, particularly off-resonance effects, which are for example caused by interferences between signals of protons that are components of fat molecules, and such proton signals which do not result from fat molecules, are minimized.

An especially advantageous suppression of proton signals of fat molecules, which is optionally used in the procedure according to the invention, is described in the publications by H. Moriguchi and colleagues (Magnetic Resonance in Medicine; Vol. 50; pp 915; 2003). As there described, suppression occurs based on at least two successive data acquisitions, each data acquisition preferably leading to the complete spiral coverage of the k-space. For each of these data acquisitions a time interval is fixed, also known as echo time $_{THE}$, starting at a temporal center of the slice-selective α-high-frequency impulse and ending with the beginning of the application of the magnetic gradients for k-space encoding. For the first data acquisition, the determined time interval is $n\tau$ and $(n+1)\tau$ for the following data acquisition; wherein n is a positive integral number and $\tau$ describes the time in which the core spins of the protons of the fat molecules have experienced a phase change of 180° relative to the protons of the water molecules. By means of the acquired data, phases are determined as a consequence of off-resonance effects and they are used for the correction of reconstructed pictures.

A further advantageous minimization of off-resonance effects occurs with regard to the acquired data points along the coordinate axes of the k-space, in which two coordinates of the k-space equal zero. Distances between the individual data points along the coordinate axis represented, at least partially, an influence of off-resonances. The bigger the distance of the data points to each other, the stronger the influence of the off-resonances during data acquisition. In consideration of the phases inherent to the acquired data points after acquisition, the acquired data points are transformed, if necessary, such that they have a constant distance according to the calculation. According to the determination of the constant distance to each other and the subsequent transformation of the data points along the coordinate axes, the remaining acquired data points of the k-space are transformed so that after transformation all data points of a spiral k-space coverage have the constant distance to each other in the parallel direction to the coordinate axes. In a preferred embodiment of the invention, the data-acquisition module for the acquisition of data is repeated for acquiring data of at least one further slice.

For the slice selection of the further slice, the usual techniques of the imaging magnetic resonance are used, for example a modulation of the central frequency of the high-frequency impulse. Furthermore, all known procedures for slice selection may be used.

The advantage of this embodiment is the quick acquisition of mainly $T_1$-weighted signals of a number M of slices which cover a large volume area. For example, the volume area of the brain of a test person can be divided into 48 slices of small thickness. This enlargement of the dimensions of data acquisition comprises furthermore, in an unlimited way, the data acquisition at N time points, so that after the acquisition of the mainly $T_1$-weighted signals of at least N×M mainly $T_1$-weighted images, a data evaluation is possible. Thus, for example mainly $T_1$-weighted images with a spatial resolution of 256×256 pixel for 48 slices at 25 time moments can be reconstructed, the acquisition time of which is clinically extremely relevant (ca. 1 minute).

In an especially preferred embodiment of the invention, the magnetic gradient $G_z$ for the further k-space encoding is at least in sections applied before the magnetic gradient $G_x$ and $G_y$, wherein the magnetic gradient $G_z$ has a constant temporal course during one application period. Thus, mainly $T_1$-weighted signals with a predetermined encoding in z-direction of the k-space can be acquired, wherein the encoding is advantageously preselected by means of an adequate selection of an amplitude of the magnetic gradient $G_z$. It has been found to be especially advantageous to repeat the data-acquisition module for a selected amplitude of the magnetic gradient $G_z$ N times before a different amplitude is selected.

Subsequent to the generation of a further spin-lattice relaxation by means of the 180° high-frequency impulse, which is preceded by the 90° high-frequency impulse, the amplitude of the gradient $G_z$ within the data-acquisition module is advantageously applied such that different $k_z$ encodings of the k-space are available after a further spin-lattice relaxation. Corresponding to a number P which may be predetermined, this procedure is optionally repeated P times.

After the acquisition of the mainly $T_1$-weighted signals as well as after the processing of the data points, at least P×N data sets are available, wherein each data set can be illustrated within a three-dimensional k-space ($k_x$, $k_y$, $k_z$). Each of these three-dimensional k-spaces has an arithmetic spiral on the level which is parallel to the space spanned by the vectors $k_x$ and $k_y$, with a relative distance to the origin of the k-space in the direction of the vector $k_z$. The relative distance is determined by the amplitude of the magnetic gradient $G_z$ on which the respective acquisition is based.

In an especially advantageous embodiment, the magnetic gradient $G_z$ for the further k-space encoding is applied, at least in sections, simultaneously to the magnetic gradients $G_x$ and $G_y$ and has a constant temporal course during an application period.

It has furthermore been found to be particularly advantageous if the data-acquisition module was repeated N times for a selected amplitude of the magnetic gradient $G_z$ before a further amplitude was selected.

Additionally, after the generation of a further spin-lattice relaxation, the amplitude of the gradient $G_z$ within the further acquisition module is advantageously applied such that different $k_z$ encodings of the k-space are available subsequent to the respective generation of a further spin-lattice relaxation. This process is optionally repeated P times.

In this embodiment, the temporal resolution is further increased by the acquisition of volume data sets within the data-acquisition module. After the acquisition of the mainly $T_1$-weighted signals, as well as after the processing of the data points, at least P×N volume data sets are available, wherein each volume data set represents a three-dimensional k-space. Each of these k-spaces is described with a three-dimensional spiral, which preferably narrows in direction of the $k_z$ vector. A degree of the diminution results from the respective amplitude of the magnetic gradient $G_z$.

Optionally further embodiments of temporal courses of the magnetic gradients are used, which leads to a further description of the k-space. For example, the k-space may be described by a three-dimensional spiral, the diameter of which increases with the vector.

The representative illustration of the volume data set by means of the three-dimensional k-space an aperture angle of the three-dimensional spiral results at least from the amplitude of the magnetic gradient $G_z$. In case after the processing of the acquired data, exterior areas of the k-space, determined by the Nyquist theorem, cannot be covered with data points, the sections of missing data points can be optionally occupied with zeros, which equals to an interpolation of the data sets after Fourier Transform.

In a further advantageous embodiment of the invention, a further k-space encoding occurs within the data-acquisition module by means of a change of the phase of least one of the magnetic gradients $G_x$ and $G_y$. The phase change relates to a complex mathematical display of the magnetic gradients.

Due to the phase change, several nested spiral coverages of the k-space can be achieved, wherein the spiral coverages of a k-space have, at least in sections, a constant distance to each other and converge only at the origin of the k-space.

Advantageously, the data-acquisition module is repeated at least once before a further generation of the spin-lattice relaxation takes place, the phase of at least one of the magnetic gradients $G_x$ and $G_y$ being varied with each repetition so that after the repetition cycle I, the k-room is covered by nested, spiral coverages.

The nested coverages of the k-space are advantageous, for example since a maximal gradient performance is reduced. In case of I repetitions the required gradient performance is reduced by a factor of $1/(I^2)$. Simultaneously, a frequency bandwidth of the acquisition is reduced by the factor $1/(I)$, the signal/noise ratio being increased compared to the simple spiral coverage of the k-space by the factor $\sqrt{(I)}$. The reduction of the maximal gradient performance furthermore allows the use of commercial gradient systems with moderate performance data.

Furthermore, it was found to be of particular advantage to use at least the nested spiral coverage of the k-space in the area of cardiological diagnostic, since physiological stimulations (e.g. an electromechanical stimulation of the muscles) fail to appear due to the reduced gradient performance. Additionally, it has been found to be of advantage to use an electrocardiographic (ECG) triggering of the acquisition is carried out only for certain cycles of a heart-rhythm. The acquisition of mainly $T_1$-weighted signals can be used in a particular advantageous manner in the field of coronary angiography by means of the nested spiral coverage of the k-space.

According to the invention, the above-described object of a magnetic-resonance imaging system is solved by a control logic which provides an imaging procedure according to the system described immediately above.

The magnet resonance imaging system is provided with a control logic which allows the generation of the pulse sequence according to the invention.

Thus, a magnetic-resonance imaging system is provided that may be used for the acquisition of mainly $T_1$-weighted signals in clinical relevant acquisition times. The magnetic-resonance imaging system according to the invention is also very compact and has exterior dimensions which allow the use thereof in common medical practices and hospitals. Optionally, the means for the generation of the main magnetic field can be used for the generation of main magnetic fields of up to 12 Tesla. Consequently, anatomic images containing quantitative information regarding the spin-lattice relaxation time ($T_1$) of test persons can be generated under the influence of a high magnetic field. Furthermore, the magnetic-resonance imaging system according to the invention allows fast application changes of the gradients to the k-space encoding as well as for slice stimulation as well as for high gradient performances, wherein the gradients optionally have the sinusoidal temporal course and/or a rectangular temporal course within the data-acquisition module.

Advantageously, interpolation of the acquired data is already carried out during acquisition, where due to the sinusoidal temporal course of the magnetic gradients the data are interpolated from a non-linear acquisition raster on a linear raster.

In a preferred embodiment, the magnetic-resonance imaging system has means for resorting the data as well as for allocating the acquired data to a Cartesian grid; and means for Fourier reconstruction.

Thus, the resorted and allocated data can be advantageously transferred into an image room by means of common Fourier transform, so that the result are mainly $T_1$-weighted images.

Further advantages, special features and advantageous embodiments of the invention result from the following description of preferred embodiments by means of the figures.

DESCRIPTION OF THE DRAWING

In the drawing:

FIG. 1 shows the principle course of a gradient sequence as well as of a high-frequency impulse sequence of an embodiment of the imaging procedure according to the invention.

SPECIFIC DESCRIPTION

Figure 1:
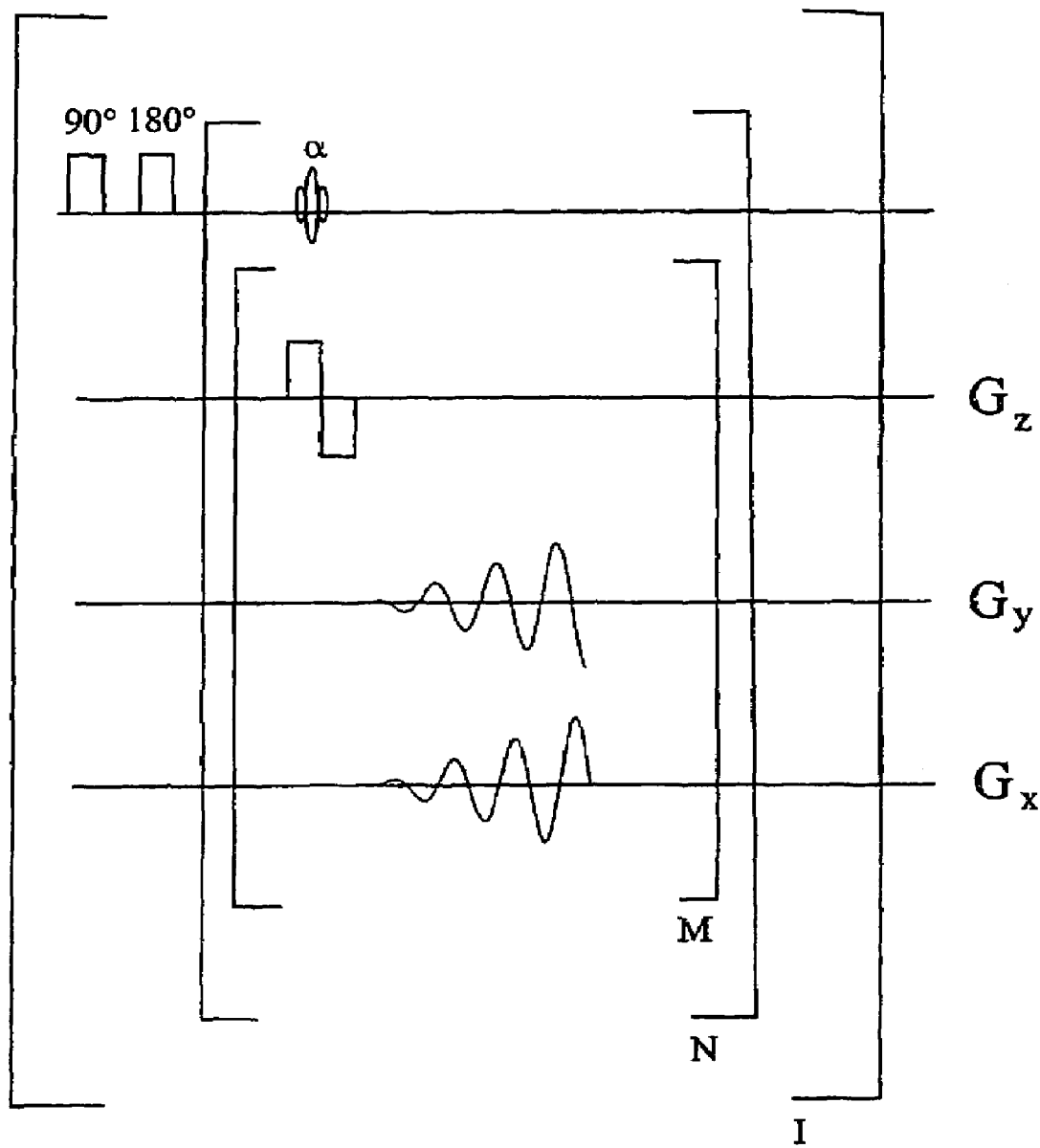
FIG. 1 is a schematic diagram of a gradient sequence as well as of high-frequency impulse sequence of an embodiment of the imaging procedure according to the invention.

At first, a sample to be examined is exposed to the static main magnetic field, the macroscopic magnetization being formed and oriented parallel to the course of the main magnetic field that corresponds to the alignment of the equilibrium state. In this equilibrium state, a transverse component of the macroscopic magnetization is small or equals zero.

The applied non slice-selective 90° high-frequency impulse saturates the macroscopic magnetization. The acquisition time of data depends in theory at least of the performance of the used gradient system, of possible physiological factors of the sample to be examined (electrophysiological threshold of the muscles, etc.) as well as of the time constant $T_1$ of the sample to be examined. The preceding application of the non slice-selective 90° high-frequency impulse is advantageous, since a respectively corresponding value of the macroscopic magnetization inverted by the subsequent 180° high-frequency impulse is available at the beginning of the first slice-selective α-high-frequency impulse, subsequent to the inversion even after a plurality of non slice-selective stimulations. Thus, the acquisition time can be significantly reduced.

After a freely selectable regeneration time during which the macroscopic magnetization is formed again in the direction of the equilibrium state, the non slice-selective 180° high-frequency impulse inverts the macroscopic magnetization, so that the longitudinal component of the macroscopic magnetization extends in anti-parallel direction to the direction of the main magnetic field after the application of the high-frequency impulse. Due to the energetic interactions of the nuclear components, the core spins, of the macroscopic magnetization with its surroundings, spin-lattice relaxation occurs which leads to the time-dependant regeneration of the original alignment of the macroscopic magnetization parallel to the static main magnetic field.

Subsequently to the non slice-selective inversion of the macroscopic magnetization a first slice of the sample is selected by means of the excitation of the core spin with the help of the slice-selective α-high-frequency impulse. The α-high-frequency impulse uses only a part of the longitudinal component of the macroscopic magnetization for the generation of the transverse component of the macroscopic magnetization. After the slice-selective excitation, the magnetic gradients $G_x$ and $G_y$ are simultaneously applied for k-space encoding. The simultaneous course of the magnetic gradients $G_x$ and $G_y$ is sinusoidal and has an increasing amplitude. In this case, the data acquisition of the mainly $T_1$-weighted signal is carried out in the presence of the magnetic gradients $G_x$ and $G_y$. One example of a course of a resulting first spiral coverage of the k-space can be seen in the illustration of the level of the k-space in FIG. 2.

At the end of the application cycle of the magnetic gradients $G_x$ and $G_y$, the data acquisition of the coverage is completed. On average, the acquired mainly $T_1$-weighted signals contrast dependant on the available longitudinal component.

After data acquisition of the first coverage of the k-space a further slice is selected by means of a further application of the slice-selective α-high-frequency impulse, followed by the same k-space encoding as before. After such a repeated acquisition of mainly $T_1$-weighted signals of the same k-space encoding for a predetermined number (M) of different slices, the first slice of the sample is again stimulated by the slice-selective α-high-frequency impulse, the data of further signals of the same k-space encoding being acquired. According to this scheme, the data are acquired after inversion of the macroscopic magnetization with constant k-space encoding for M slices and to N different time points relative to the moment of the inversion.

Subsequent to the data acquisition of the signals of M slices at N time points, a further non slice-selective inversion of the macroscopic magnetization by the repeated application of the non slice-selective 90° high-frequency impulse followed by the non-slice-selective 180° high-frequency impulse in the temporal distance of the regeneration period is carried out. After the excitation of the first slice by means of the slice-selective α-high-frequency impulse, the magnetic gradients $G_x$ and $G_y$ are simultaneously applied for k-space encoding. The temporal course of the magnetic gradient $G_x$ and $G_y$ has a sinusoid shape and an increasing amplitude, the phase of at least one of the magnetic gradients $G_x$ and $G_y$ having been changed for further k-space encoding.

Successively, the data of a further k-space coverage are acquired again for M slices and at N time points.

Figure 2:
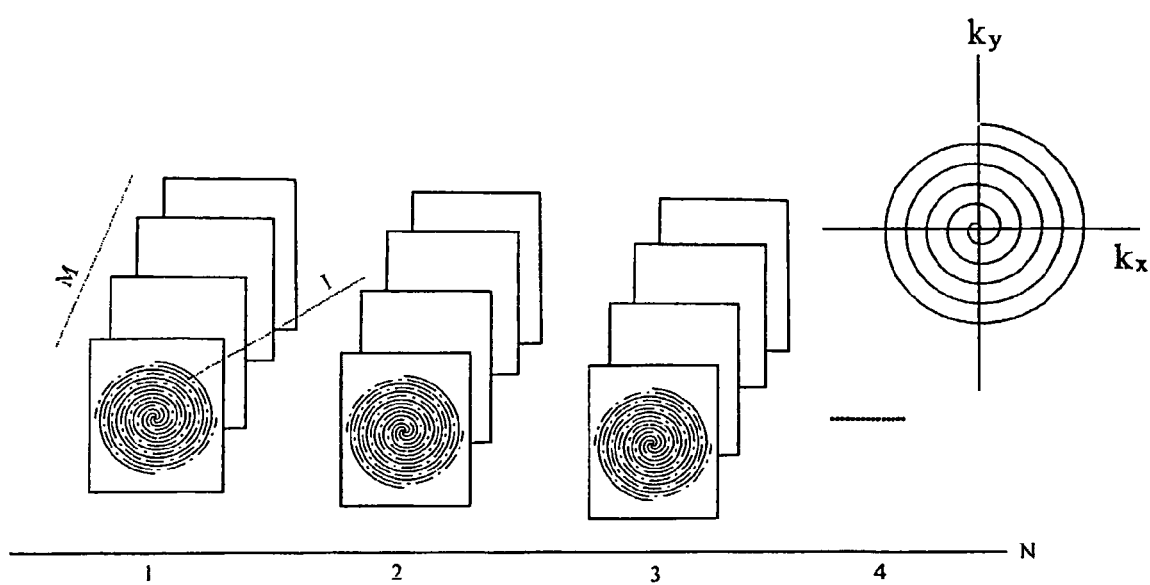
FIG. 2 is a schematic diagram of an advantageous sequence of repetitions of the data-acquisition module with an exemplary display of a spiral coverage of one level of the k-space.

FIG. 2 shows a schematic display of the above-described sequence of repetitions of the data-acquisition module with the exemplary display of the spiral coverage of a level of the k-space. The horizontal numbered line in FIG. 2 represents the respective acquisition time point N and the successively nested schematic displays of the k-space levels represent the data acquisitions for M slices. The continuous line as well as the dashed line illustrate different coverages (I) of the k-space.

Figure 3:
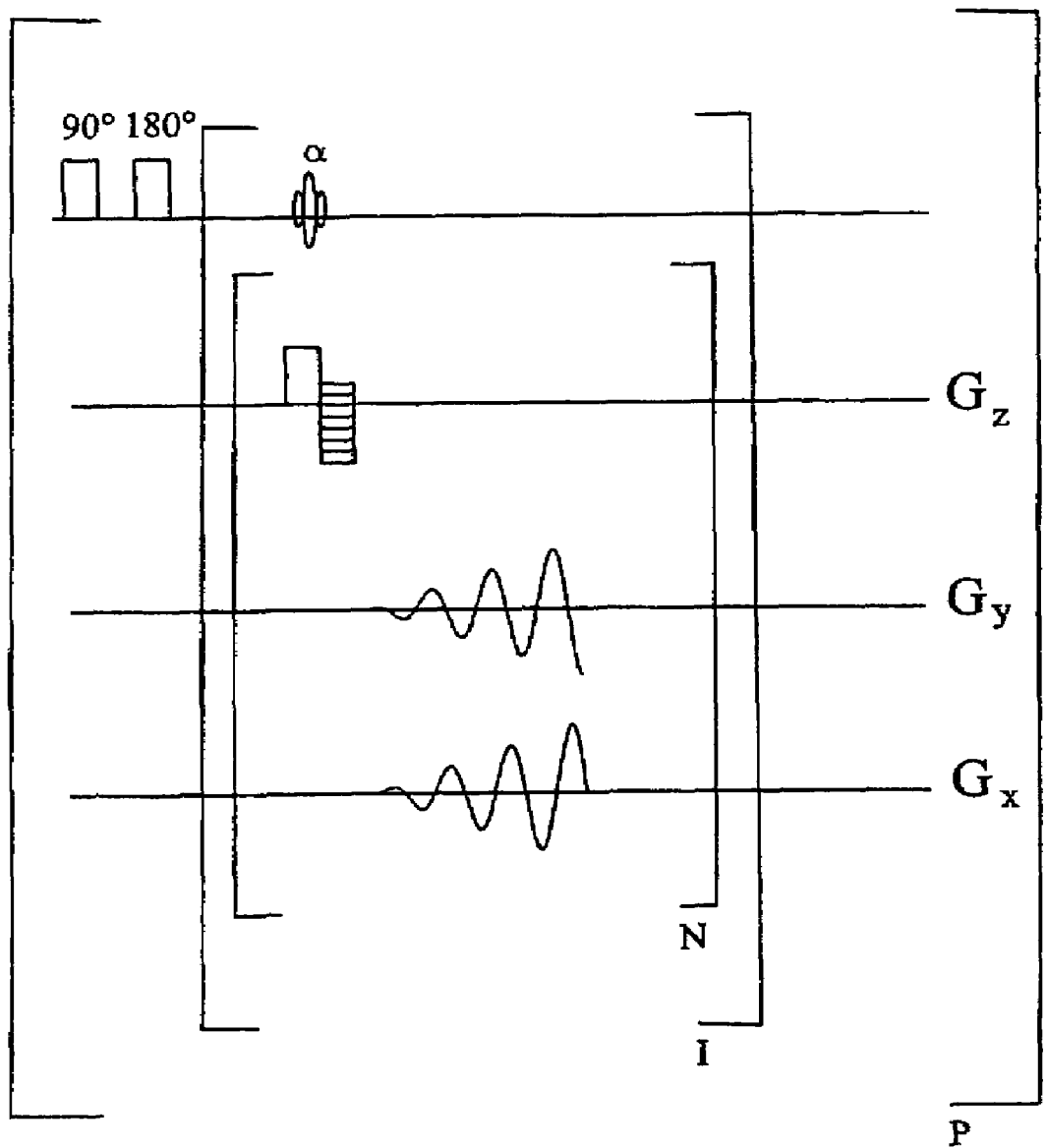
FIG. 3 is a schematic diagram of a gradient sequence as well as of a high-frequency impulse sequence of an embodiment of the imaging procedure according to the invention.

FIG. 3 shows the principle of the gradient sequence as well as of the high-frequency impulse sequence of the preferred embodiment of the imaging procedure according to the invention.

The further preferred embodiment is distinguished from the above-described embodiment according to FIGS. 1 and 2 by the fact that the magnetic gradient $G_z$ for the further k-space encoding is applied before the magnetic gradients $G_x$ and $G_y$ after the slice selection by the α-high-frequency impulse. The magnetic gradient $G_z$ has a constant temporal course during an application period. The data-acquisition module is repeated N×I times for the selected amplitude of the magnetic gradient $G_z$ before the further succession of saturation and inversion of the macroscopic magnetization by the 90° high-frequency impulse as well as by the following 180° high-frequency impulse. Consequently, for each selected $k_z$ encoding result I coverages at N time points.

Figure 4:
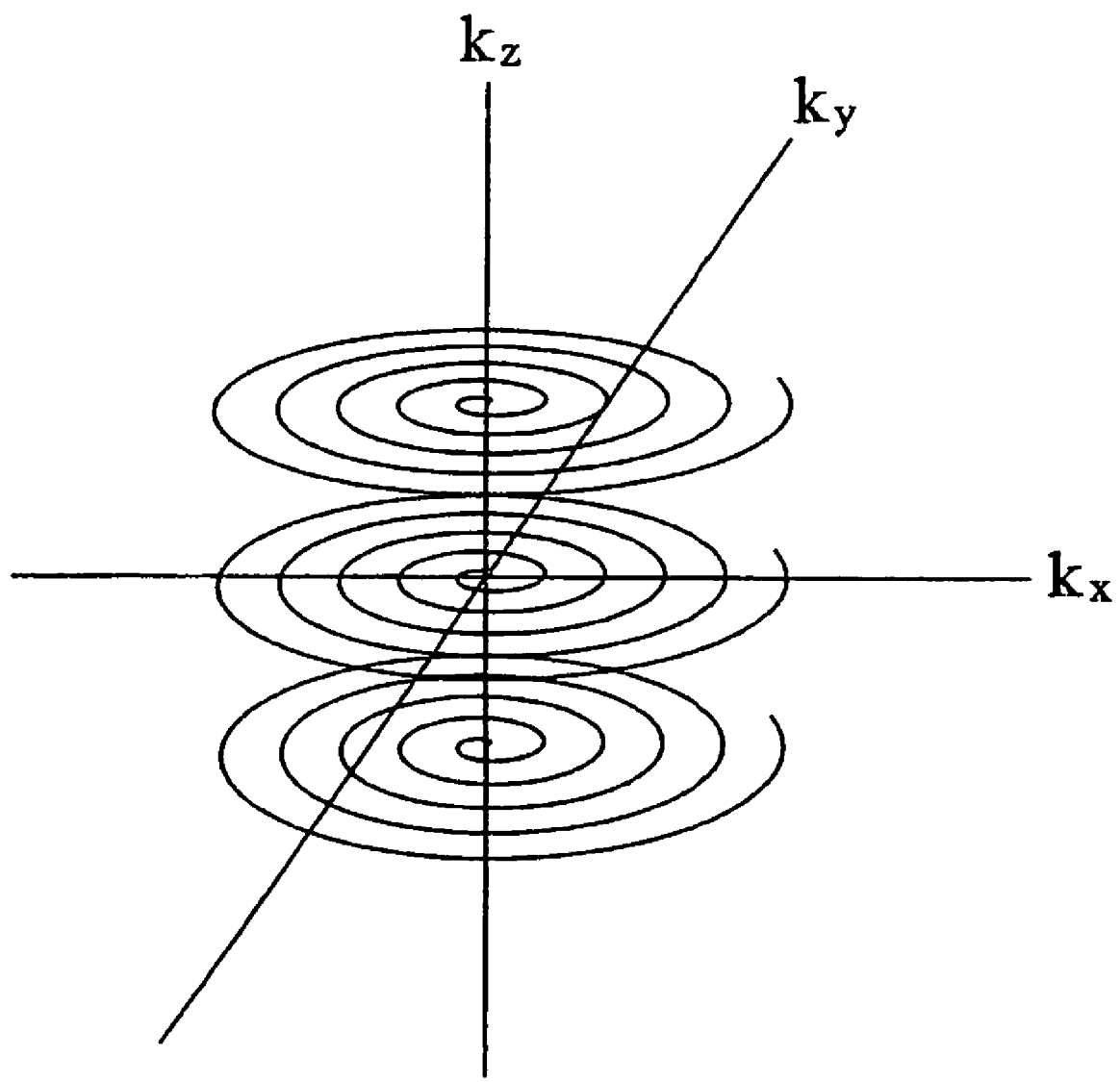
FIG. 4 is a schematic display of spiral coverages of the k-space according to the embodiment of FIG. 3.

FIG. 4 shows an overlapped display of 3 three-dimensional k-spaces with 3 arithmetic spirals on levels which are parallel to the surface spanned by the vectors $k_x$ and $k_y$ of respectively 3 different $k_z$ encodings. Such a overlapping display represent 3 repetitions of the data-acquisition module of the embodiment according to FIG. 3.

Figure 5:
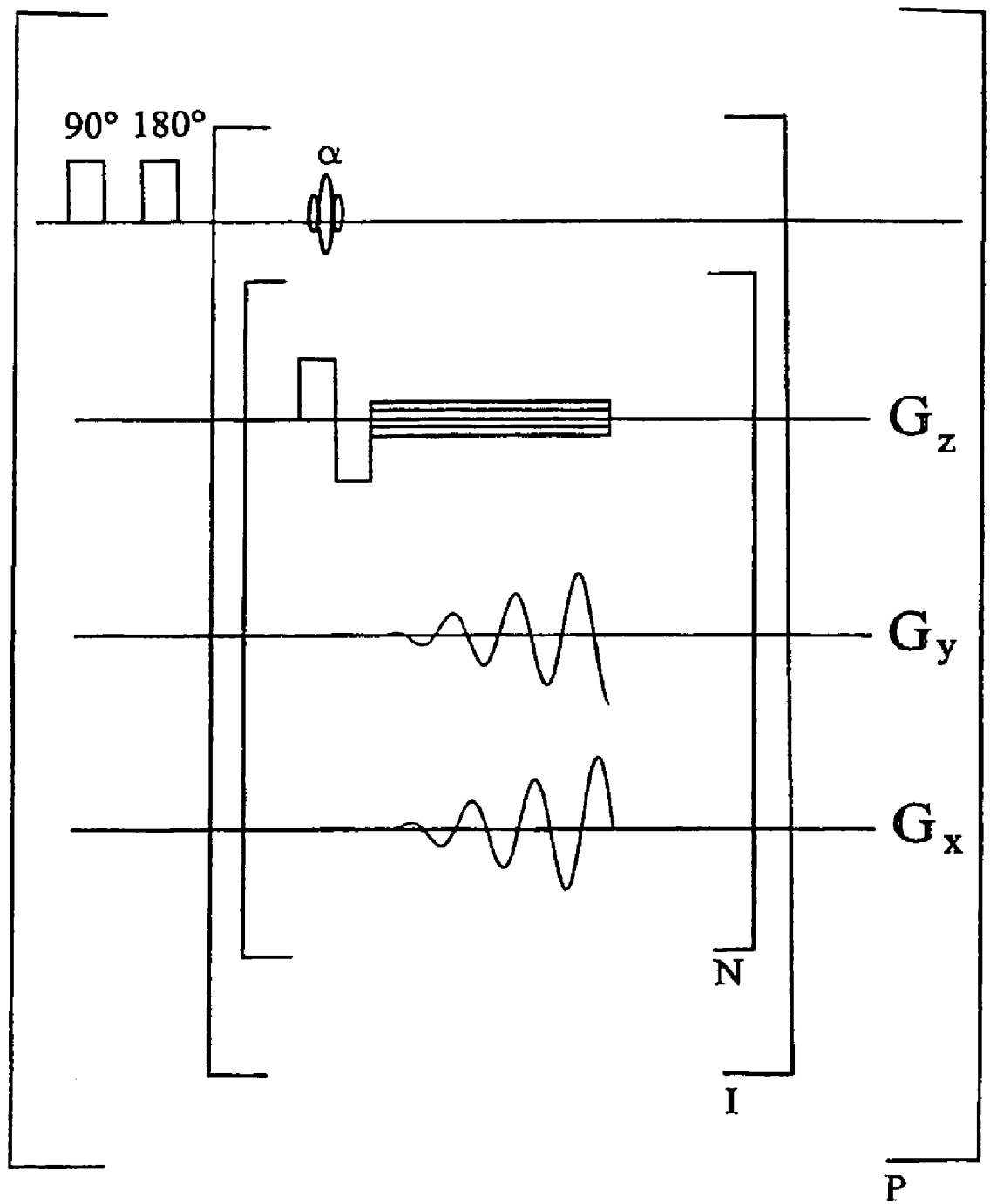
FIG. 5 is a schematic diagram of a gradient sequence as well as of high-frequency impulse sequence of a further especially preferred embodiment of the imaging procedure according to the invention.

FIG. 5 shows the principle of gradient sequence as well as of the high-frequency impulse sequence of the especially preferred embodiment of the imaging procedure according to the invention.

In an especially preferred embodiment, the magnetic gradient Gz is applied after the slice selection by the α-high-frequency impulse for further k-space encoding simultaneously to the magnetic gradient $G_x$ and $G_y$ and has furthermore a constant temporal course during an application period. The data-acquisition module is repeated N×I times for the selected amplitude of the magnetic gradient $G_z$, before a further amplitude is selected. The amplitude of the gradient $G_z$ is applied during the further repetitions of the acquisition module after the generation of a further spin-lattice relaxation such that different $k_z$ encodings of the k-space after the respective generation of a further spin-lattice relaxation are available. This process is repeated P times.

Figure 6:
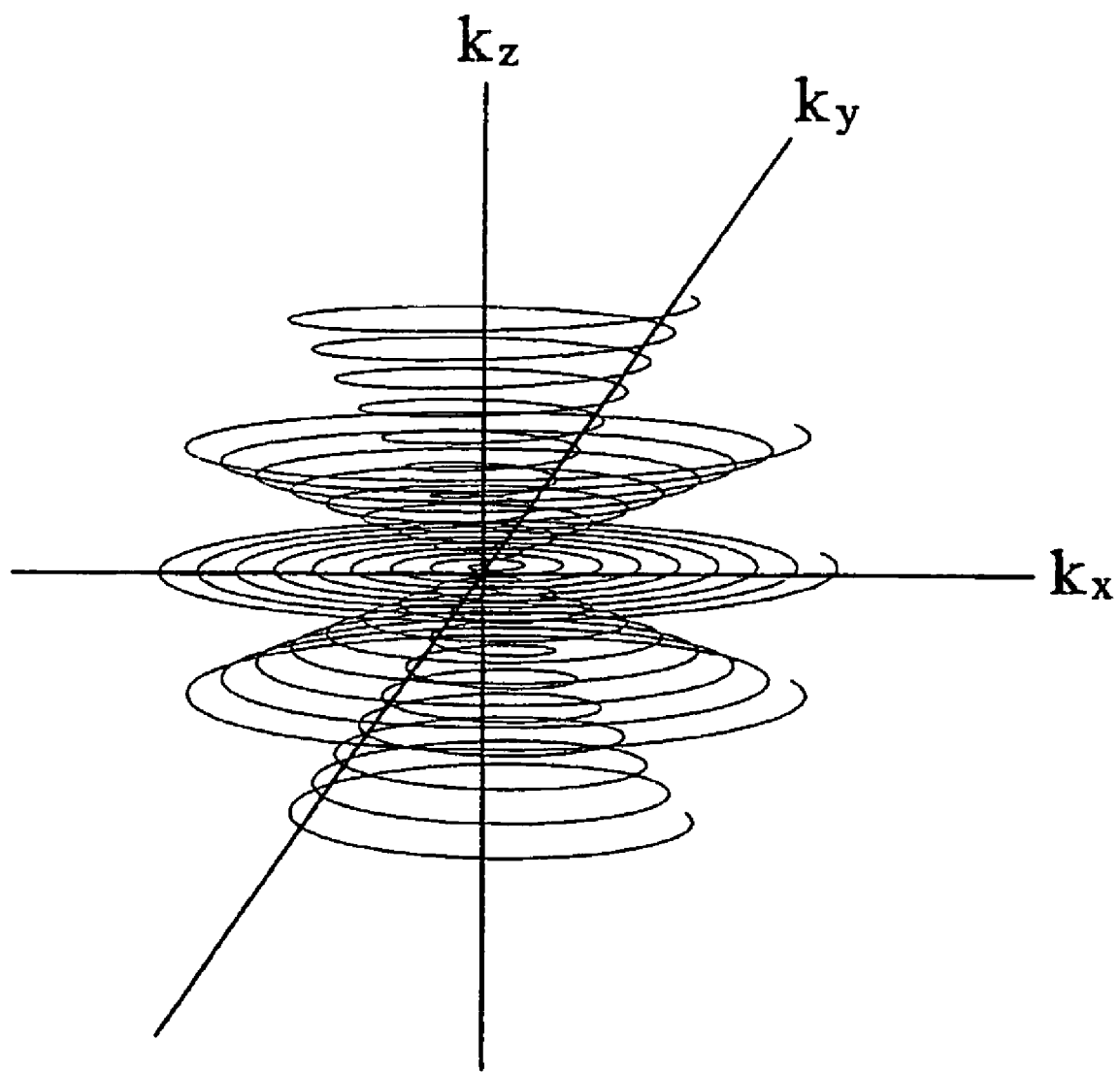
FIG. 6 is a schematic display of spiral coverages of the k-space according to the embodiment of FIG. 5.

FIG. 6 shows a representative display of volume data sets by means of a three-dimensional k-space. The different aperture angles of the three-dimensional spiral are due to 5 different amplitudes of the magnetic gradient $G_z$.

FIG. 6 shows that in the case of volume data sets of different amplitudes of the magnetic gradient $G_z$, exterior areas, determined by the Nyquist theorem, can not be occupied by data points. Optionally, the exterior areas of the data acquisition volume in which no data points were acquired can be occupied by zeros which allows the application of a Fourier transform.

The invention claimed is:

1. A method of acquiring an MR image using an imaging procedure for the acquisition of the longitudinal spin-lattice relaxation time ($T_1$), with at least one data-acquisition module comprising at least one slice-selective α-high-frequency impulse as well as magnetic gradients ($G_x$, $G_y$, $G_z$) for slice selection and/or for encoding of a k-space, the acquired data describing a time point of a spin-lattice relaxation and the data-acquisition module for acquiring data of at least one further time point being repeated, wherein furthermore at least one 180° high-frequency impulse or at least one 180° high-frequency impulse and at least one 90° high-frequency impulse preceding the 180° high-frequency impulse for the generation of a spin-lattice relaxation precede the data-acquisition module, wherein the magnetic gradients $G_x$ and $G_y$ for k-space encoding are simultaneously applied subsequent to the slice-selective α-high-frequency impulse, a temporal course of the magnetic gradients $G_x$ and $G_y$ being sinusoidal, so that the result is a spiral coverage of the k-space; and wherein, furthermore, data are acquired during k-space encoding and generating a T1-weighted image using the acquired data.

2. The method according to claim 1 wherein the data-acquisition module is repeated for acquiring data of at least one further slice.

3. The method according to claim 1 wherein the magnetic gradient $G_z$ for further k-space encoding is preceding the magnetic gradients $G_x$ and $G_y$, at least in sections, and in that it has a constant temporal course during an application period.

4. The method according to claim 1 wherein the magnetic gradient $G_z$ for further k-space encoding, is at least in sections applied simultaneously to the magnetic gradients $G_x$ and $G_y$, and in that it has a constant temporal course during an application period.

5. The method according to claim 1 wherein further k-space encoding is carried out during the data-acquisition module by means of a phase change in at least one of the magnetic gradients $G_x$ and $G_y$.

6. A magnetic-resonance imaging system for the quantification of the longitudinal spin-lattice relaxation time ($T_1$) with means for generating magnetic gradients, means for generating high-frequency impulses, means for acquiring signals and means for generating a static magnetic field, wherein a control logic generates an imaging method according to claim 1.

7. The magnetic-resonance imaging system according to claim 6, further comprising
    means for re-sorting and interpolating the acquired data as well as of means for Fourier reconstruction.

* * * * *